United States Patent
Shen et al.

(10) Patent No.: US 9,490,801 B2
(45) Date of Patent: Nov. 8, 2016

(54) RAPID CUTOFF DEVICE AND OPERATION METHOD FOR SCR AC SWITCHES

(71) Applicant: Ablerex Electronics Co., Ltd., New Taipei (TW)

(72) Inventors: Jia-Min Shen, Kaohsiung (TW); Yi-Hao Chang, Kaohsiung (TW); Chia-Hung Lee, Kaohsiung (TW)

(73) Assignee: Ablerex Electronics Co., Ltd., New Taipei (TW)

( * ) Notice: Subject to any disclaimer, the term of this patent is extended or adjusted under 35 U.S.C. 154(b) by 148 days.

(21) Appl. No.: 14/587,307

(22) Filed: Dec. 31, 2014

(65) Prior Publication Data
US 2016/0065209 A1 Mar. 3, 2016

(30) Foreign Application Priority Data
Sep. 2, 2014 (TW) ................................. 103130238

(51) Int. Cl.
| | | |
|---|---|---|
| *H03K 17/725* | (2006.01) | |
| *H03K 17/73* | (2006.01) | |
| *H03K 17/04* | (2006.01) | |
| *H03K 17/12* | (2006.01) | |
| *H03K 17/10* | (2006.01) | |
| *H03K 17/13* | (2006.01) | |

(52) U.S. Cl.
CPC ............ *H03K 17/725* (2013.01); *H03K 17/73* (2013.01); *H03K 17/0403* (2013.01); *H03K 17/105* (2013.01); *H03K 17/125* (2013.01); *H03K 17/136* (2013.01)

(58) Field of Classification Search
None
See application file for complete search history.

(56) References Cited

U.S. PATENT DOCUMENTS

| | | | | |
|---|---|---|---|---|
| 3,763,395 | A * | 10/1973 | Shilling ................. | H05B 39/08 315/199 |
| 4,302,687 | A * | 11/1981 | Yoshino ............... | H03K 17/725 327/381 |
| 4,876,468 | A * | 10/1989 | Libert .................... | H03K 17/06 327/438 |
| 5,036,234 | A * | 7/1991 | Friedrich ............ | H02M 5/2573 327/455 |
| 5,982,051 | A * | 11/1999 | Cousy .................... | H01H 9/547 307/115 |
| 6,373,319 | B1 * | 4/2002 | Rault ................... | H03K 17/725 327/452 |
| 7,079,363 | B2 | 7/2006 | Chung | |
| 8,890,371 | B2 | 11/2014 | Gotou | |
| 2003/0021131 | A1 * | 1/2003 | Nadot ..................... | H02M 1/34 363/55 |
| 2010/0060187 | A1 * | 3/2010 | Newman, Jr. ...... | H05B 33/0818 315/291 |
| 2016/0056820 | A1 * | 2/2016 | Shen ...................... | H03K 17/73 327/473 |

* cited by examiner

*Primary Examiner* — Tuan T Lam
(74) *Attorney, Agent, or Firm* — Alan D. Kamrath; Kamrath IP Lawfirm, P.A.

(57) ABSTRACT

A rapid cutoff device includes a thyristor AC switch for supplying an AC current from a first AC circuit to a second AC circuit. A serially-connected circuit of a first switch and a first capacitor parallel-connects with the first AC circuit. A serially-connected circuit of a second switch and a second capacitor parallel-connects with the second AC circuit. When cutting off the thyristor AC switch, the first switch is operated to conduct the first capacitor in a first direction for the AC current charging to the first capacitor, alternatively, the second switch is operated to conduct the second capacitor in a second direction for the AC current charging to the second capacitor, thereby lowering a current in the thyristor AC switch approaching a zero value and thus rapidly cutting off it.

20 Claims, 1 Drawing Sheet

RAPID CUTOFF DEVICE AND OPERATION METHOD FOR SCR AC SWITCHES

BACKGROUND OF THE INVENTION

1. Field of the Invention

The present invention relates to a rapid cutoff device and operation method for SCR AC switches. More particularly, the present invention relates to a bi-directional rapid cutoff device and operation method for SCR AC switches.

2. Description of the Related Art

Generally, switch elements mainly include active switch elements and mechanical switch elements. However, when the mechanical switch element is applied in an AC circuit, there is a need of providing adequate capabilities of switching off and eliminating electric arc.

In addition, in switching-off operation, the mechanical switch element will generate electric arc which will damage the contact points and reduce the service life. In order to avoid the aforesaid drawbacks, the active switch elements have replaced the mechanical switch elements. MOSFETs (Metal-Oxide-Semiconductor Field-Effect Transistors) and IGBTs (Insulated Gate Bipolar Transistors) of the active switch elements are generally applied to provide a function of hard switching. In switching-off operation, the active switch element, however, applied in both of the AC circuit and the DC circuit can effectively and rapidly cut off the current therein and further has an advantage of resulting in no electric arc. Even though the active switch element has the advantage of rapidly switching, it also has characteristics of low ratings of voltages and currents and cannot endure large inrush currents. Accordingly, the active switch element has a drawback of low reliability.

Furthermore, thyristor switch elements are excellent high-power elements which have high voltage rating and high inrush current capability. The thyristor switch elements further have several advantages of a wider range of applications, longer service life, higher reliability, rapid switching speed, minimized dimensions, easy and economic maintenance, lower power consumption and low manufacture cost. However, when the thyristor switch element is applied in the AC circuit, the thyristor switch element is completely cut off by decreasing its current to a near-zero value after stopping a drive signal. Namely, the thyristor switch element cannot be cut off immediately by stopping the drive signal.

By way of example, U.S. Pat. Publication No. 20120086427, entitled "Alternating Current/Direct Current Two-way Switch," corresponding to Taiwanese Pat. Publication No. 201106623, discloses an AC/DC two-way switch. The AC/DC two-way switch connects between an AC power source or a DC power source and a load to control a power supply to the load. The AC/DC two-way switch includes: a bi-directional semiconductor switch element having a transistor structure connected in series between a power source and the load; a rectifying unit connected in parallel between the first input terminal and a second input terminal; a power source unit for converting an output voltage from the rectifying unit into a stable voltage; and a controller for controlling an entire operation of the AC/DC two-way switch. The AC/DC two-way switch further includes a driving unit for turning on the bi-directional semiconductor switch element in response to a control signal.

However, the above AC/DC two-way switch applied in a DC power distribution system can avoid occurrence of electric arc in switching on and off operation. The above-mentioned publication is incorporated herein by reference for purposes including, but not limited to, indicating the background of the present invention and illustrating the situation of the art.

Another U.S. Pat. No. 7,079,363, entitled "Hybrid DC Electromagnetic contactor," discloses a hybrid DC electromagnetic contactor. The hybrid DC electromagnetic contactor includes: a power unit for supplying a certain power voltage; a main contact point of a breaking switch for providing a supply path of the power voltage by being switched in accordance with a voltage apply to an operational coil; a switch for providing a supply path of the power voltage according to a gate signal; a snubber circuit for charging voltage at the both ends of the switch in turning off of the switch and being applied-discharged an electric current when the charged voltage is not less than a certain voltage; and a discharge current removing unit for removing the discharge current by providing a discharge current path to a load block in turning off of the switch, it is possible to minimize a size of leakage current when the main contact point and the semiconductor switch are turned off.

However, the hybrid DC electromagnetic contactor provides the semiconductor switch parallel connected with the mechanical contact switch such that it can avoid occurrence of electric arc in switching on and off operation. The above-mentioned patent is incorporated herein by reference for purposes including, but not limited to, indicating the background of the present invention and illustrating the situation of the art.

As is described in greater detail below, the present invention provides a rapid cutoff device and operation method for SCR AC switches. A thyristor AC switch electrically connects between a first AC circuit and a second AC circuit. When the thyristor AC switch cuts off, a first switch is operated, according to a first direction of an AC current, to conduct a first capacitor which is charged by the AC current, or alternatively, a second switch is operated, according to a second direction of the AC current, to conduct a second capacitor which is charged by the AC current. Forcibly, a current of the thyristor AC switch is rapidly lowered for approaching a zero value, thereby rapidly cutting off the thyristor AC switch. Advantageously, the present invention can accomplish rapidly cutting off the thyristor AC switch and is unlike an operation method of the conventional thyristor AC switch which requires the current of the thyristor AC switch gradually decreasing to approach a zero value and then cutting off the thyristor AC switch.

SUMMARY OF THE INVENTION

The primary objective of this invention is to provide a rapid cutoff device and operation method for SCR AC switches. A thyristor AC switch electrically connects between a first AC circuit and a second AC circuit. The first AC circuit supplies power to the second AC circuit via the thyristor AC switch when the thyristor AC switch is switched on. When the thyristor AC switch cuts off, a switch is operated to conduct a capacitor which is charged by an AC current passing through the thyristor AC switch. Accordingly, the AC current of the thyristor AC is rapidly lowered for approaching a zero value, thereby rapidly cutting off the thyristor AC switch. Advantageously, the rapid cutoff device of the present invention is successful in rapidly cutting off the thyristor AC switch.

The rapid cutoff device for SCR AC switches in accordance with an aspect of the present invention includes:

a thyristor AC switch electrically connects between a first AC circuit and a second AC circuit, with switching on the thyristor AC switch to supply an AC current;

a first switch selected from a thyristor switch or a solid-state switch;

a first capacitor serially connected with the first switch, with the first switch and the first capacitor parallel-connected with the first AC circuit;

a second switch selected from a thyristor switch or a solid-state switch;

a second capacitor serially connected with the second switch, with the second switch and the second capacitor parallel-connected with the second AC circuit; and wherein when the thyristor AC switch cuts off, the first switch is operated, according to a first direction of the AC current, to conduct the first capacitor which is charged by the AC current and a current of the thyristor AC switch is rapidly lowered for approaching a zero value, thereby rapidly cutting off the thyristor AC switch;

or, wherein when the thyristor AC switch cuts off, the second switch is operated, according to a second direction of the AC current, to conduct the second capacitor which is charged by the AC current and the current of the thyristor AC switch is rapidly lowered for approaching a zero value, thereby rapidly cutting off the thyristor AC switch.

In a separate aspect of the present invention, the thyristor AC switch connected between the first AC circuit and the second AC circuit includes a first AC circuit end and a second AC circuit end.

In a further separate aspect of the present invention, two ends of the first capacitor parallel-connects with a first discharge circuit including a first resistor and a first discharge switch serially connected thereto, or two ends of the second capacitor parallel-connects with a second discharge circuit including a second resistor and a second discharge switch serially connected thereto.

In yet a further separate aspect of the present invention, a first bypass switch reversely parallel-connects with the second switch and is selected from a thyristor switch or a solid-state switch, or a second bypass switch reversely parallel-connects with the first switch and is selected from a thyristor switch or a solid-state switch.

In yet a further separate aspect of the present invention, the thyristor AC switch further includes a mechanical switch parallel-connected therewith to form a hybrid switch.

In yet a further separate aspect of the present invention, the thyristor AC switch further includes a mechanical switch serially connected therewith to form an isolation switch.

The operation method of the rapid cutoff device for SCR AC switches in accordance with an aspect of the present invention includes:

reversely parallel-connecting a first thyristor switch element and a second thyristor switch element to form a thyristor AC switch, with connecting the first thyristor switch element and the second thyristor switch element between a first AC circuit and a second AC circuit;

serially connecting a first switch with a first capacitor, and further parallel-connecting the first switch and the first capacitor with the first AC circuit;

serially connecting a second switch with a second capacitor, and further parallel-connecting the second switch and the second capacitor with the second AC circuit;

supplying a first-direction current of an AC current via the first thyristor switch element while switching on the first thyristor switch element;

supplying a second-direction current of the AC current via the second thyristor switch element while switching on the second thyristor switch element;

wherein when the first thyristor switch element cuts off, the first switch is operated, according to the first-direction current of the AC current, to conduct the first capacitor which is charged by the AC current and thus a current of the first thyristor switch element is rapidly lowered for approaching a zero value, thereby rapidly cutting off the first thyristor switch element;

or, wherein when the second thyristor switch element cuts off, the second switch is operated, according to the second-direction current of the AC current, to conduct the second capacitor which is charged by the AC current and thus a current of the second thyristor switch element is rapidly lowered for approaching a zero value, thereby rapidly cutting off the second thyristor switch element.

In a separate aspect of the present invention, the thyristor AC switch connected between the first AC circuit and the second AC circuit includes a first AC circuit end and a second AC circuit end.

In a further separate aspect of the present invention, two ends of the first capacitor parallel-connects with a first discharge circuit including a first resistor and a first discharge switch serially connected thereto, or two ends of the second capacitor parallel-connects with a second discharge circuit including a second resistor and a second discharge switch serially connected thereto.

In yet a further separate aspect of the present invention, a first bypass switch reversely parallel-connects with the second switch and is selected from a thyristor switch or a solid-state switch, or a second bypass switch reversely parallel-connects with the first switch and is selected from a thyristor switch or a solid-state switch.

In yet a further separate aspect of the present invention, the thyristor AC switch further includes a mechanical switch parallel-connected therewith to form a hybrid switch.

In yet a further separate aspect of the present invention, the thyristor AC switch further includes a mechanical switch serially connected therewith to form an isolation switch.

Further scope of the applicability of the present invention will become apparent from the detailed description given hereinafter. However, it should be understood that the detailed description and specific examples, while indicating preferred embodiments of the invention, are given by way of illustration only, since various will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

It is noted that a rapid cutoff device and operation method for SCR AC switches in accordance with the preferred embodiment of the present invention can be applicable to various AC switches, including thyristor AC switches, isolation thyristor AC switches, hybrid thyristor AC switches or other AC switches, for example, which are not limitative of the present invention. Additionally, the rapid cutoff device and operation method for SCR AC switches of the preferred embodiment of the present invention is suitable for various AC power sources or AC power distribution systems (e.g. utility power) which are not limitative of the present invention.

Figure 1:
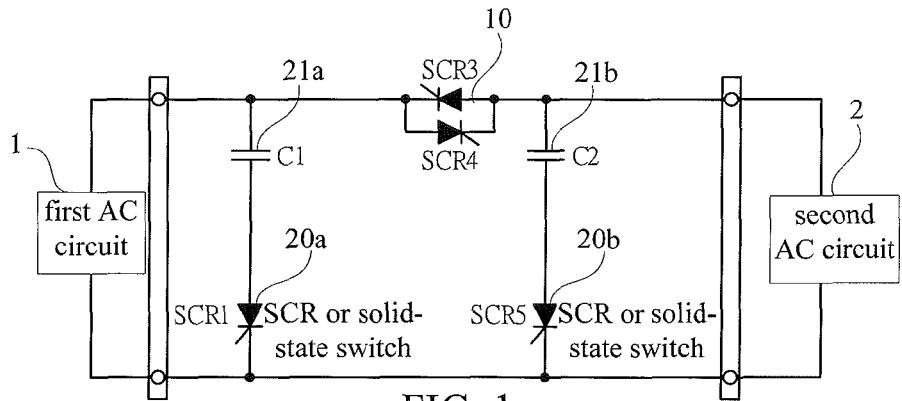
FIG. 1 is a schematic view of a rapid cutoff device for SCR AC switches in accordance with a first preferred embodiment of the present invention.

FIG. 1 shows a schematic view of the rapid cutoff device for SCR AC switches in accordance with the first preferred embodiment of the present invention. Referring now to FIG. 1, the rapid cutoff device for SCR AC switches of the first preferred embodiment includes a thyristor AC switch 10, a first switch 20a, a second switch 20b, a first capacitor 21a and a second capacitor 21b. The thyristor AC switch 10 further includes a first thyristor switch element SCR4 and a second thyristor switch element SCR3 reversely parallel-connected thereto. The rapid cutoff device connects between a first AC circuit 1 (e.g. AC power source) and a second AC circuit 2 (e.g. load).

With continued reference to FIG. 1, by way of example, the thyristor AC switch 10 has a first AC circuit end and a second AC circuit end. The thyristor AC switch 10 electrically connects with the first AC circuit 1 which can supply an AC current to the second AC circuit 2 via the thyristor AC switch 10 when the first thyristor switch element SCR4 and the second thyristor switch element SCR3 are switched on. However, the AC current passing through the thyristor AC switch 10 is bidirectional. In operation, the first thyristor switch element SCR4 conducts a first-direction current (i.e. direction from the first AC circuit end to the second AC circuit end of the thyristor AC switch 10) and, conversely, the second thyristor switch element SCR3 conducts a second-direction current (i.e. direction from the second AC circuit end to the first AC circuit end of the thyristor AC switch 10).

Referring again to the left side in FIG. 1, by way of example, the first switch 20a is selected from a thyristor switch or a solid-state switch. The first switch 20a serially connects with the first capacitor 21a and a serially-connected circuit of the first switch 20a and the first capacitor 21a further parallel-connects between the first AC circuit 1 and the thyristor AC switch 10. The first switch 20a controllably conducts the first capacitor 21a since the first switch 20a serially connects with the first capacitor 21a.

Turning now to the right side in FIG. 1, correspondingly, by way of example, the second switch 20b is also selected from a thyristor switch or a solid-state switch. The second switch 20b serially connects with the second capacitor 21b and a serially-connected circuit of the second switch 20b and the second capacitor 21b further parallel-connects between the second AC circuit 2 and the thyristor AC switch 10. Also, the second switch 20b controllably conducts the second capacitor 21b since the second switch 20b serially connects with the second capacitor 21b.

Still referring to FIG. 1, when the first thyristor switch element SCR4 of the thyristor AC switch 10 cuts off, the first switch 20a is operated to conduct the first capacitor 21a. An initial voltage of the first capacitor 21a is 0V when it is conducted. The first capacitor 21a is charged by the first-direction current of the AC current such that a current passing through the first thyristor switch element SCR4 is rapidly lowered and approaches a zero value, thereby rapidly cutting off the first thyristor switch element SCR4. Advantageously, the present invention is successfully rapidly cutting off the thyristor AC switch 10 in the first direction of the AC current.

Still referring to FIG. 1, correspondingly, when the second thyristor switch element SCR3 of the thyristor AC switch 10 cuts off, the second switch 20b is operated to conduct the second capacitor 21b. An initial voltage of the second capacitor 21b is 0V when it is conducted. The second capacitor 21b is charged by the second-direction current of the AC current such that the current passing through the second thyristor switch element SCR3 is rapidly lowered and approaches a zero value, thereby rapidly cutting off the second thyristor switch element SCR3. Advantageously, the present invention is also successfully rapidly cutting off the thyristor AC switch 10 in the second direction of the AC current.

Figure 2:
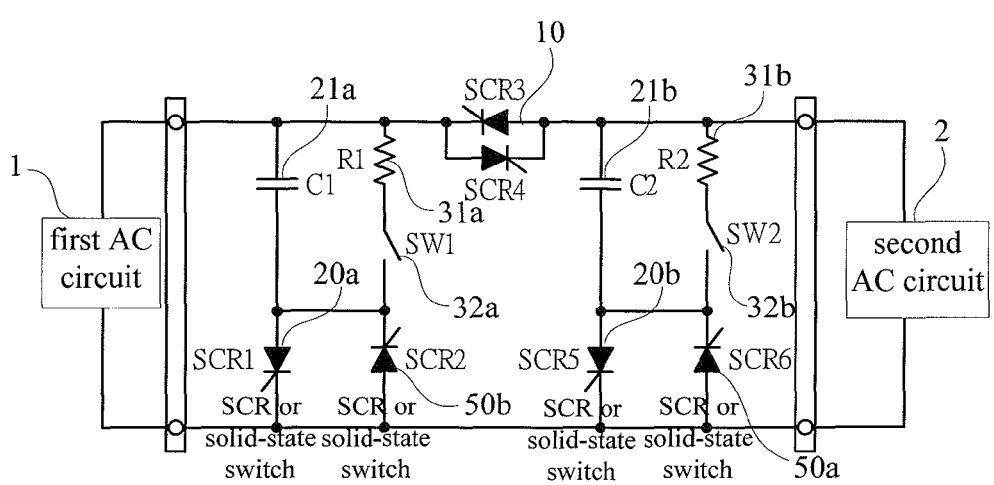
FIG. 2 is a schematic view of a rapid cutoff device for SCR AC switches in accordance with a second preferred embodiment of the present invention.

FIG. 2 shows a schematic view, similar to FIG. 1, of the rapid cutoff device for SCR AC switches in accordance with the second preferred embodiment of the present invention. Referring now to FIG. 2, comparing with the first embodiment, the rapid cutoff device of the second preferred embodiment includes a thyristor AC switch 10, a first switch 20a, a second switch 20b, a first capacitor 21a, a second capacitor 21b, a first resistor 31a, a second resistor 31b, a first discharge switch 32a, a second discharge switch 32b, a first bypass switch 50a and a second bypass switch 50b. The thyristor AC switch 10 further includes a first thyristor switch element SCR4 and a second thyristor switch element SCR3 reversely parallel-connected thereto. The rapid cutoff device connects between a first AC circuit 1 and a second AC circuit 2.

With continued reference to FIG. 2, by way of example, the thyristor AC switch 10 has a first AC circuit end and a second AC circuit end. The thyristor AC switch 10 electrically connects with the first AC circuit 1 which can supply an AC current to the second AC circuit 2 via the thyristor AC switch 10 when the first thyristor switch element SCR4 and the second thyristor switch element SCR3 are switched on. However, the AC current passing through the thyristor AC switch 10 is bidirectional. In operation, the first thyristor switch element SCR4 conducts a first-direction current (i.e. direction from the first AC circuit end to the second AC circuit end of the thyristor AC switch 10) and, conversely, the second thyristor switch element SCR3 conducts a second-direction current (i.e. direction from the second AC circuit end to the first AC circuit end of the thyristor AC switch 10).

Referring again to the left side in FIG. 2, by way of example, the first switch 20a is selected from a thyristor switch or a solid-state switch. The first switch 20a serially connects with the first capacitor 21a and a serially-connected circuit of the first switch 20a and the first capacitor 21a further parallel-connects between the first AC circuit 1 and the thyristor AC switch 10. The first switch 20a controllably conducts the first capacitor 21a since the first switch 20a serially connects with the first capacitor 21a. The first resistor 31a and the first discharge switch 32a are serially connected or are connected by other connection manners. A serially-connected circuit of the first resistor 31a and the first discharge switch 32a further parallel-connects with two ends of the first capacitor 21a.

Turning now to the right side in FIG. 2, correspondingly, by way of example, the second switch 20b is also selected from a thyristor switch or a solid-state switch. The second switch 20b serially connects with the second capacitor 21b and a serially-connected circuit of the second switch 20b and the second capacitor 21b further parallel-connects between the second AC circuit 2 and the thyristor AC switch 10. Also, the second switch 20b controllably conducts the second capacitor 21b since the second switch 20b serially connects with the second capacitor 21b. Also, the second resistor 31b and the second discharge switch 32b are serially connected or are connected by other connection manners. A serially connected circuit of the second resistor 31b and the second discharge switch 32b further parallel-connects with two ends of the second capacitor 21b.

Still referring to FIG. 2, when the first thyristor switch element SCR4 of the thyristor AC switch 10 cuts off, the first switch 20a is operated to conduct the first capacitor 21a. An initial voltage of the first capacitor 21a is 0V when it is conducted. The first capacitor 21a is charged by the first-direction current of the AC current such that a current passing through the first thyristor switch element SCR4 is rapidly lowered and approaches a zero value, thereby rapidly cutting off the first thyristor switch element SCR4. Advantageously, the present invention is successfully rapidly cutting off the thyristor AC switch 10 in the first direction of the AC current.

With continued reference to FIG. 2, the first switch 20a is switched off after the thyristor AC switch 10 cuts off. However, there is a residual voltage between two ends of the first capacitor 21a. The first discharge switch 32a is switched on to discharge the first capacitor 21a via the first resistor 31a until the residual voltage of the first capacitor 21a is completely discharged. Afterward the first discharge switch 32a is switched off for the next cut-off operation of the thyristor AC switch 10 by maintaining 0V of the first capacitor 21a.

With continued reference to FIG. 2, the parasitical inductance existed in the second AC circuit 2. When the thyristor AC switch 10 rapidly cuts off, the parasitical inductance in the second AC circuit 2 will result in an induced high voltage in the thyristor AC switch 10. The second switch 20b require parallel-connecting with the first bypass switch 50a since the high voltage will damage the thyristor AC switch 10. The first bypass switch 50a is selected from a thyristor switch or a solid-state switch and further reversely parallel-connects with the second switch 20b. When the first switch 20a is operated in cutting off the thyristor AC switch 10, the first bypass switch 50a is synchronously operated. When the first thyristor switch element SCR4 of the thyristor AC switch 10 instantly cuts off, a current of the parasitical inductance existed in the second AC circuit 2 can pass through the first bypass switch 50a and then can supply to the second capacitor 21b to form a loop. Advantageously, it can speed up the operation of cutting off the first thyristor switch element SCR4 to avoid the occurrence of the induced high voltage which causes at the two ends of the thyristor AC switch 10.

With continued reference to FIG. 2, correspondingly, when the second thyristor switch element SCR3 of the thyristor AC switch 10 cuts off, the second switch 20b is operated to conduct the second capacitor 21b. An initial voltage of the second capacitor 21b is 0V when it is conducted. The second capacitor 21b is charged by the second-direction current of the AC current such that the current passing through the second thyristor switch element SCR3 is rapidly lowered and approaches a zero value, thereby rapidly cutting off the second thyristor switch element SCR3. Advantageously, the present invention is also successfully rapidly cutting off the thyristor AC switch 10 in the second direction of the AC current.

With continued reference to FIG. 2, the serially-connected circuit of the second resistor 31b and the second discharge switch 32b parallel-connects with two ends of the second capacitor 21b. The second switch 20b is switched off after the thyristor AC switch 10 cuts off. However, there is a residual voltage between two ends of the second capacitor 21b. The second discharge switch 32b is switched on to discharge the second capacitor 21b via the second resistor 31b until the residual voltage of the second capacitor 21b is completely discharged. Afterward the second discharge switch 32b is switched off for the next cut-off operation of the thyristor AC switch 10 by maintaining 0V of the second capacitor 21b.

With continued reference to FIG. 2, the parasitical inductance existed in the first AC circuit 1. When the thyristor AC switch 10 rapidly cuts off, the parasitical inductance in the first AC circuit 1 will also result in an induced high voltage in the thyristor AC switch 10. The first switch 20a requires parallel-connecting with the second bypass switch 50b since the high voltage will damage the thyristor AC switch 10. The second bypass switch 50b is selected from a thyristor switch or a solid-state switch and further reversely parallel-connects with the first switch 20a. When the second switch 20b is operated in cutting off the thyristor AC switch 10, the second bypass switch 50b is synchronously operated. When the second thyristor switch element SCR3 of the thyristor AC switch 10 instantly cuts off, a current of the parasitical inductance existed in the first AC circuit 1 can pass through the second bypass switch 50b and then can supply to the first capacitor 21a to form a loop. Advantageously, it can also speed up the operation of cutting off the second thyristor switch element SCR3 to avoid the occurrence of the induced high voltage which causes at the two ends of the thyristor AC switch 10.

Figure 3:
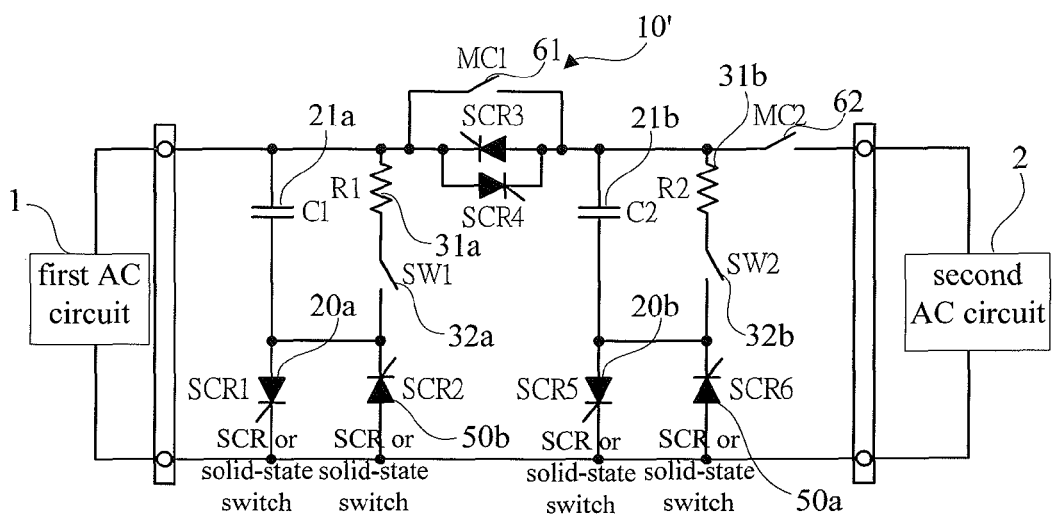
FIG. 3 is a schematic view of a rapid cutoff device for SCR AC switches in accordance with a third preferred embodiment of the present invention.

FIG. 3 shows a schematic view, similar to FIGS. 1 and 2, of the rapid cutoff device for SCR AC switches in accordance with the third preferred embodiment of the present invention. Referring to FIG. 3, comparing with the second embodiment, the rapid cutoff device of the third preferred embodiment includes a thyristor AC switch 10', a first switch 20a, a second switch 20b, a first capacitor 21a, a second capacitor 21b, a first resistor 31a, a second resistor 31b, a first discharge switch 32a, a second discharge switch 32b, a first bypass switch 50a, a second bypass switch 50b, a first mechanical switch 61 and a second mechanical switch 62. In a preferred embodiment, the thyristor AC switch 10' parallel-connects with the first mechanical switch 61 to form a hybrid switch. In another preferred embodiment, the thyristor AC switch 10' serially connects with the second mechanical switch 62 to form an isolation switch. In another preferred embodiment, the thyristor AC switch 10' parallel-connects with the first mechanical switch 61 and further serially connects with the second mechanical switch 62.

Although the invention has been described in detail with reference to its presently preferred embodiment, it will be understood by one of ordinary skill in the art that various modifications can be made without departing from the spirit and the scope of the invention, as set forth in the appended claims.

What is claimed is:
1. A rapid cutoff device for SCR AC switches comprising:
   a thyristor AC switch electrically connects between a first AC circuit and a second AC circuit, with switching on the thyristor AC switch to supply an AC current;
   a first switch;
   a first capacitor serially connected with the first switch, with the first switch and the first capacitor parallel-connected with the first AC circuit;
   a second switch; and a second capacitor serially connected with the second switch, with the second switch and the second capacitor parallel-connected with the second AC circuit;

wherein when the thyristor AC switch cuts off, the first switch is operated, according to a first direction of the AC current, to conduct the first capacitor which is charged by the AC current such that a current of the thyristor AC switch is rapidly lowered for approaching a zero value, thereby rapidly cutting off the thyristor AC switch;

or, wherein when the thyristor AC switch cuts off, the second switch is operated, according to a second direction of the AC current, to conduct the second capacitor which is charged by the AC current such that the current of the thyristor AC switch is rapidly lowered for approaching a zero value, thereby rapidly cutting off the thyristor AC switch.

2. The rapid cutoff device for the SCR AC switches as defined in claim 1, wherein two ends of the first capacitor parallel-connects with a first discharge circuit including a first resistor and a first discharge switch serially connected thereto.

3. The rapid cutoff device for the SCR AC switches as defined in claim 1, wherein two ends of the second capacitor parallel-connects with a second discharge circuit including a second resistor and a second discharge switch serially connected thereto.

4. The rapid cutoff device for the SCR AC switches as defined in claim 1, wherein a first bypass switch reversely parallel-connects with the second switch and is selected from a thyristor switch or a solid-state switch.

5. The rapid cutoff device for the SCR AC switches as defined in claim 1, wherein a second bypass switch reversely parallel-connects with the first switch and is selected from a thyristor switch or a solid-state switch.

6. The rapid cutoff device for the SCR AC switches as defined in claim 1, wherein the thyristor AC switch further includes at least one mechanical switch connected therewith.

7. The rapid cutoff device for the SCR AC switches as defined in claim 1, wherein the thyristor AC switch further includes a first mechanical switch and a second mechanical switch connected therewith.

8. The rapid cutoff device for the SCR AC switches as defined in claim 7, wherein the first mechanical switch parallel-connects with the thyristor AC switch to form a hybrid switch.

9. The rapid cutoff device for the SCR AC switches as defined in claim 7, wherein the second mechanical switch serially connects with the thyristor AC switch to form an isolation switch.

10. The rapid cutoff device for the SCR AC switches as defined in claim 7, wherein the first mechanical switch parallel-connects with the thyristor AC switch to form a hybrid switch while the second mechanical switch serially connects with the thyristor AC switch to form an isolation switch.

11. An operation method of a rapid cutoff device for SCR AC switches comprising:

reversely parallel-connecting a first thyristor switch element and a second thyristor switch element to form a thyristor AC switch, with connecting the first thyristor switch element and the second thyristor switch element between a first AC circuit and a second AC circuit;

serially connecting a first switch with a first capacitor, and further parallel-connecting the first switch and the first capacitor with the first AC circuit;

serially connecting a second switch with a second capacitor, and further parallel-connecting the second switch and the second capacitor with the second AC circuit;

supplying a first-direction current of an AC current via the first thyristor switch element while switching on the first thyristor switch element;

supplying a second-direction current of the AC current via the second thyristor switch element while switching on the second thyristor switch element;

wherein when the first thyristor switch element cuts off, the first switch is operated, according to the first-direction current of the AC current, to conduct the first capacitor which is charged by the AC current such that a current of the first thyristor switch element is rapidly lowered for approaching a zero value, thereby rapidly cutting off the first thyristor switch element;

or, wherein when the second thyristor switch element cuts off, the second switch is operated, according to the second-direction current of the AC current, to conduct the second capacitor which is charged by the AC current such that a current of the second thyristor switch element is rapidly lowered for approaching a zero value, thereby rapidly cutting off the second thyristor switch element.

12. The operation method of the rapid cutoff device as defined in claim 11, wherein two ends of the first capacitor parallel-connects with a first discharge circuit including a first resistor and a first discharge switch serially connected thereto.

13. The operation method of the rapid cutoff device as defined in claim 11, wherein two ends of the second capacitor parallel-connects with a second discharge circuit including a second resistor and a second discharge switch serially connected thereto.

14. The operation method of the rapid cutoff device as defined in claim 11, wherein a first bypass switch reversely parallel-connects with the second switch and is selected from a thyristor switch or a solid-state switch.

15. The operation method of the rapid cutoff device as defined in claim 11, wherein a second bypass switch reversely parallel-connects with the first switch and is selected from a thyristor switch or a solid-state switch.

16. The operation method of the rapid cutoff device as defined in claim 11, wherein the thyristor AC switch further includes at least one mechanical switch connected therewith.

17. The operation method of the rapid cutoff device as defined in claim 11, wherein the thyristor AC switch further includes a first mechanical switch and a second mechanical switch connected therewith.

18. The operation method of the rapid cutoff device as defined in claim 17, wherein the first mechanical switch parallel-connects with the thyristor AC switch to form a hybrid switch.

19. The operation method of the rapid cutoff device as defined in claim 17, wherein the second mechanical switch serially connects with the thyristor AC switch to form an isolation switch.

20. The operation method of the rapid cutoff device as defined in claim 17, wherein the first mechanical switch parallel-connects with the thyristor AC switch to form a hybrid switch while the second mechanical switch serially connects with the thyristor AC switch to form an isolation switch.

* * * * *